(12) United States Patent
Hsieh et al.

(10) Patent No.: US 10,331,002 B2
(45) Date of Patent: Jun. 25, 2019

(54) PIXEL ARRAY SUBSTRATE

(71) Applicant: Au Optronics Corporation, Hsinchu (TW)

(72) Inventors: Hsiu-Chun Hsieh, Hsinchu (TW); Yi-Wei Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/936,454

(22) Filed: Mar. 27, 2018

(65) Prior Publication Data

US 2018/0284508 A1 Oct. 4, 2018

(30) Foreign Application Priority Data

Mar. 31, 2017 (TW) .............................. 106110966 A

(51) Int. Cl.
| | |
|---|---|
| *H01L 27/12* | (2006.01) |
| *G02F 1/1368* | (2006.01) |
| *G02F 1/1362* | (2006.01) |
| *H01L 29/786* | (2006.01) |
| *G02F 1/136* | (2006.01) |
| *G02F 1/1343* | (2006.01) |

(52) U.S. Cl.
CPC ........ *G02F 1/1368* (2013.01); *G02F 1/13624* (2013.01); *G02F 1/136286* (2013.01); *H01L 27/124* (2013.01); *H01L 27/1222* (2013.01); *H01L 27/1255* (2013.01); *H01L 29/78645* (2013.01); *G02F 1/134363* (2013.01); *G02F 2001/13606* (2013.01); *G02F 2001/13685* (2013.01); *G02F 2001/134372* (2013.01); *G02F 2202/104* (2013.01)

(58) Field of Classification Search
CPC ............... G02F 1/1368; G02F 1/13624; H01L 27/1222; H01L 27/124
See application file for complete search history.

(56) References Cited

U.S. PATENT DOCUMENTS

| | | | |
|---|---|---|---|
| 7,599,014 B2 * | 10/2009 | Shih ................. | G02F 1/136286 349/139 |
| 7,728,917 B2 | 6/2010 | Hsiao et al. | |
| 7,924,352 B2 | 4/2011 | Hsiao et al. | |
| | (Continued) | | |

FOREIGN PATENT DOCUMENTS

| | | |
|---|---|---|
| TW | I396911 | 5/2013 |
| TW | 201619675 | 6/2016 |

*Primary Examiner* — Nicholas J Tobergte
(74) *Attorney, Agent, or Firm* — JCIPRNET

(57) ABSTRACT

A pixel array substrate including a plurality of pixel units disposed on a substrate is provided. Each of the pixel units includes a scan line, a data line and an active element. The active element includes a semiconductor layer, a gate, a source electrode and a drain electrode. The semiconductor layer has a channel region, a source region, a drain region, a first connection region and a second connection region. The first connection region is connected between the channel region and the source region. The second connection region is connected between the channel region and the drain region. A normal projection of the first connection region on the substrate and a normal projection of the second connection region on the substrate are respectively located at two opposite sides of a normal projection of the data line on the substrate.

19 Claims, 5 Drawing Sheets

(56) References Cited

U.S. PATENT DOCUMENTS

| | | | |
|---|---|---|---|
| 7,956,948 B2 | 6/2011 | Hsiao et al. | |
| 8,988,334 B2 * | 3/2015 | Ge | G09G 3/3614 |
| | | | 345/96 |
| 9,007,541 B2 * | 4/2015 | Chen | G02F 1/1362 |
| | | | 349/38 |
| 9,360,727 B1 | 6/2016 | Su et al. | |
| 2009/0173942 A1 | 7/2009 | Hsiao et al. | |
| 2010/0025692 A1 * | 2/2010 | Hsiao | H01L 29/42384 |
| | | | 257/72 |
| 2015/0179671 A1 * | 6/2015 | Chen | G02F 1/1362 |
| | | | 349/48 |
| 2016/0147124 A1 | 5/2016 | Su et al. | |

* cited by examiner

PIXEL ARRAY SUBSTRATE

CROSS-REFERENCE TO RELATED APPLICATION

This application claims the priority benefit of Taiwan application serial no. 106110966, filed on Mar. 31, 2017. The entirety of the above-mentioned patent application is hereby incorporated by reference herein and made a part of this specification.

BACKGROUND OF THE INVENTION

Field of the Invention

The invention relates to a substrate, and particularly relates to a pixel array substrate.

Description of Related Art

The advancement of display technology renders people's life more convenient with the assistance of display apparatus. Display panels have gradually become the mainstream products in the display market due to their light-and-thin characteristics.

In general, a pixel array substrate of the display panel includes a plurality of active elements. The active element is used as a switching element of a pixel unit. The active element includes a semiconductor layer, an insulating layer covering the semiconductor layer, a gate located on the insulating layer and electrically connected to a scan line, a protective layer covering the gate and a source electrode and a drain electrode located on the protective layer. To reduce the leakage of the active element, a shading pattern is often disposed below the semiconductor layer to completely shield the semiconductor layer. However, the setting of the shading pattern may cause an aperture ratio of the pixel array substrate to decrease, and the number of mask required to make the pixel array substrate is increased. Thus, the setting of the shading pattern may be omitted, but the display panel composed of the pixel array substrate without the shading pattern has serious cross-talk phenomenon and poor display quality.

SUMMARY OF THE INVENTION

The invention provides a display panel having good display quality.

The invention provides a pixel array substrate including a substrate and a plurality of pixel units disposed on the substrate. Each of the pixel units includes a scan line and a data line interlaced with each other and an active element. The active element includes a semiconductor layer, a gate, an insulating layer, a source electrode and a drain electrode. The semiconductor layer has at least one channel region, a source region, a drain region, a first connection region and a second connection region. The first connection region is connected between the at least one channel region and the source region. The second connection region is connected between the at least one channel region and the drain region. A normal projection of the first connection region on the substrate and a normal projection of the second connection region on the substrate are respectively located at two opposite sides of a normal projection of the data line on the substrate. The gate is located on the substrate and electrically connected to the scan line. The insulating layer is disposed between the semiconductor layer and the gate. The source electrode and the drain electrode are electrically connected to the source region and the drain region respectively. The source electrode is electrically connected to the data line. Particularly, at least a portion of the normal projection of the first connection region on the substrate is located between the normal projection of the data line on the substrate and a normal projection of a drain electrode of another adjacent pixel unit on the substrate.

The invention provides a pixel array substrate including a substrate and a plurality of pixel units disposed on the substrate. Each of the pixel units includes a scan line and a data line interlaced with each other and an active element. The active element includes a semiconductor layer, a gate, an insulating layer, a source electrode and a drain electrode. The semiconductor layer has at least one channel region, a source region, a drain region, a first connection region and a second connection region. The first connection region is connected between the at least one channel region and the source region. The second connection region is connected between the at least one channel region and the drain region. A normal projection of the first connection region on the substrate and a normal projection of the second connection region on the substrate are respectively located at two opposite sides of a normal projection of the data line on the substrate. The gate is located on the substrate and electrically connected to the scan line. The insulating layer is disposed between the semiconductor layer and the gate. The source electrode and the drain electrode are electrically connected to the source region and the drain region respectively. The source electrode is electrically connected to the data line. Particularly, at least a portion of the first connection region overlaps a drain electrode of another adjacent pixel unit in a normal projection direction of the substrate.

Based on the above, the pixel array substrate of an embodiment of the invention includes the plurality of pixel units. Each of the pixel units includes the scan line, the data line, the active element and the pixel electrode. The active element includes the semiconductor layer, the gate, the source electrode and the drain electrode. Particularly, a portion of the semiconductor layer of each of the pixel units is shifted to the pixel region of the adjacent pixel unit. The shifted portion of the semiconductor layer (i.e., a portion of the first connection region) and the drain electrode of the adjacent pixel unit form a compensation capacitor, thereby improving the cross-talk phenomenon and improving the display quality.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
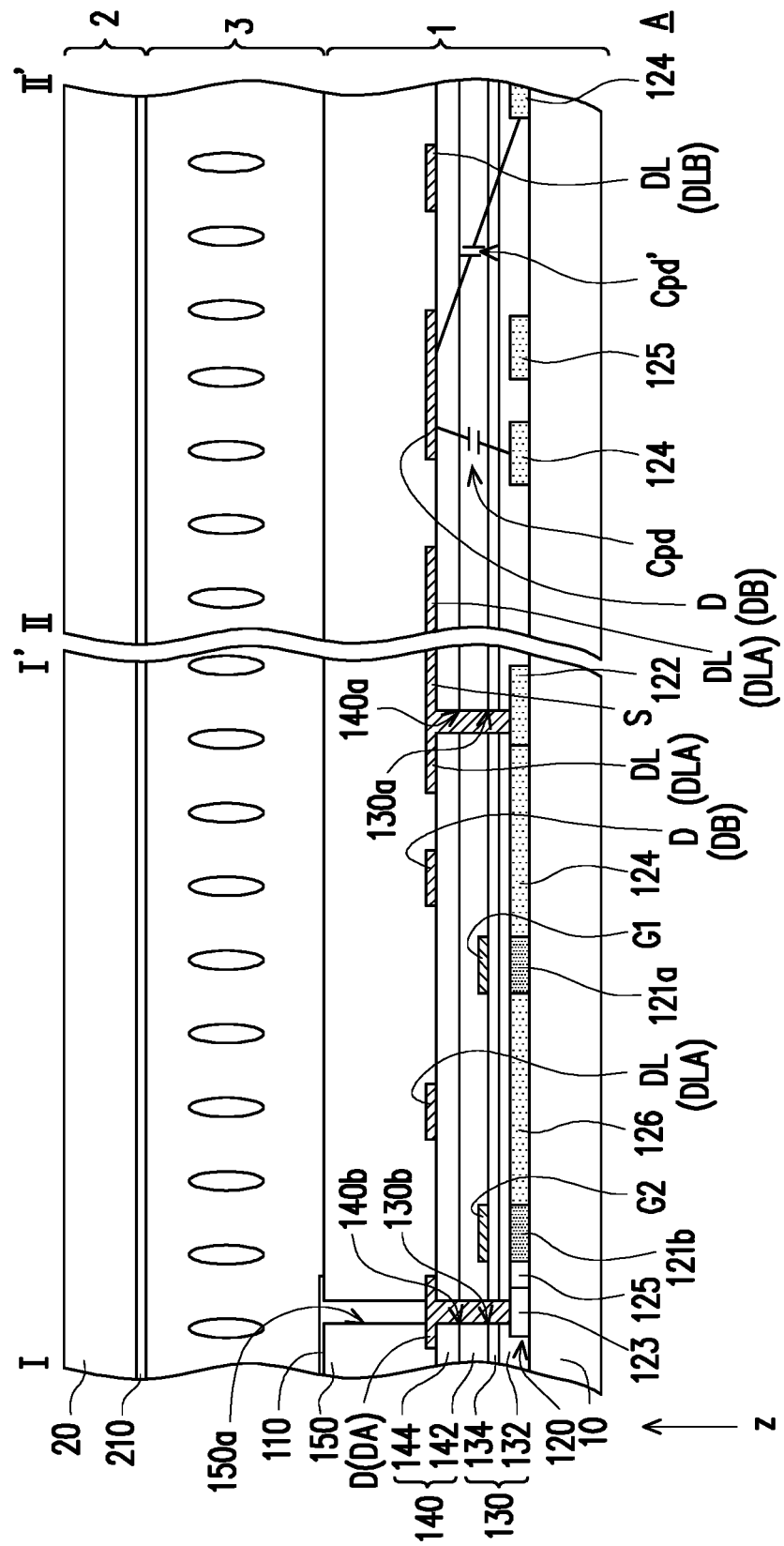
FIG. 1 is a schematic cross-sectional view of a display panel according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
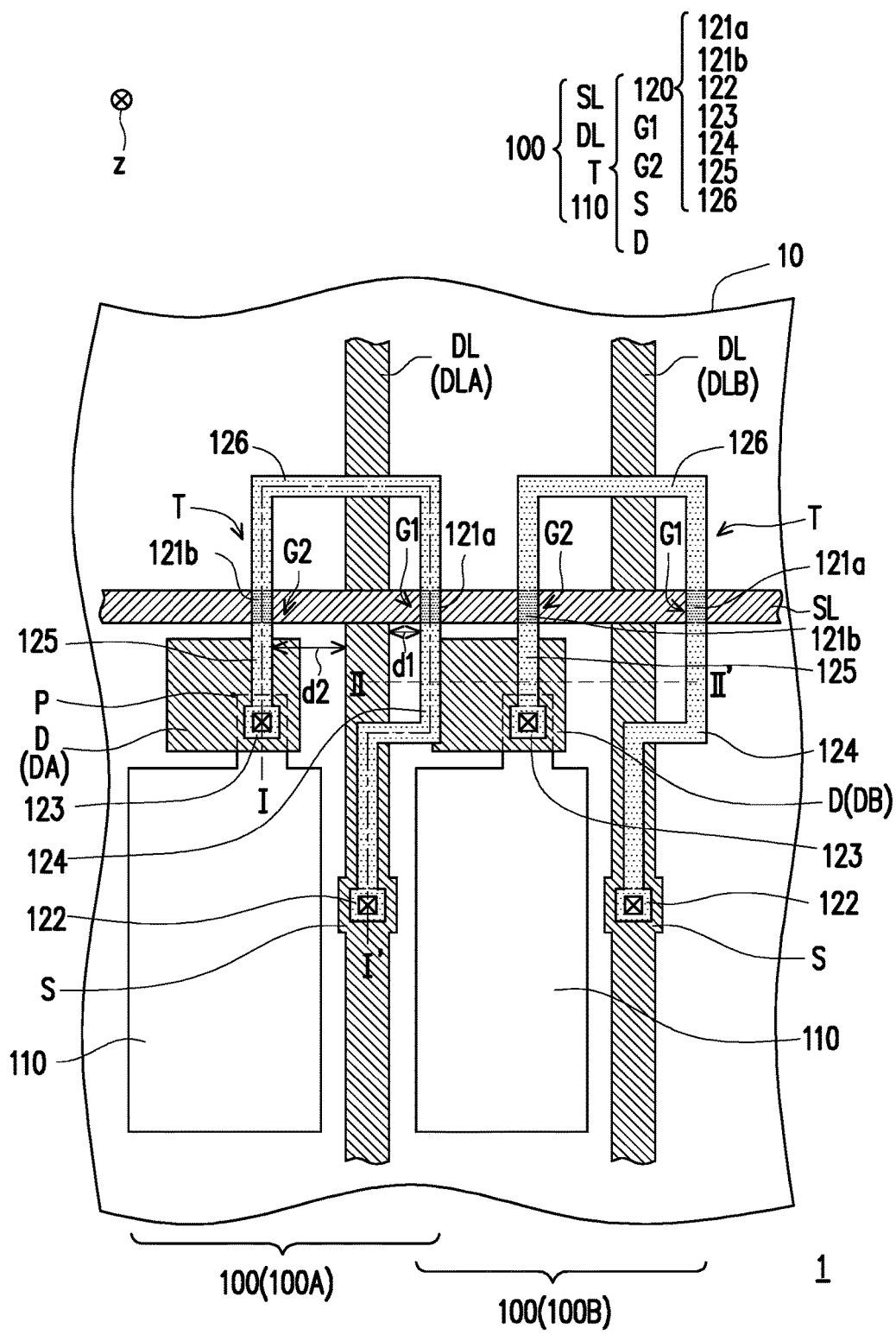
FIG. 2 is a schematic bottom view of a pixel array substrate of FIG. 1.

FIG. 1 is a schematic cross-sectional view of a display panel according to an embodiment of the invention. FIG. 2 is a schematic bottom view of a pixel array substrate 1 of FIG. 1. The pixel array substrate 1 of FIG. 1 is corresponding to section lines I-I' and II-II' of FIG. 2. The schematic bottom view of FIG. 2 is a schematic view taken along a direction z of FIG. 1. That is, the direction z is parallel to a normal projection direction of a first substrate 10. The schematic bottom view of FIG. 2 is a schematic view taken upward from a bottom surface of the first substrate 10 along the direction z. Referring to FIG. 1, a display panel A includes the pixel array substrate 1, an opposite substrate 2 opposite to the pixel array substrate 1 and a display medium 3 located between the pixel array substrate 1 and the opposite substrate 2. In the embodiment, the display medium 3 is liquid crystals, for example, but the invention is not limited thereto. In other embodiments, the display medium 3 may also be an organic light-emitting diode (OLED) or other suitable material.

Referring to FIG. 1 and FIG. 2, the pixel array substrate 1 includes the first substrate 10 and a plurality of pixel units 100 disposed on the first substrate 10. The opposite substrate 2 includes a second substrate 20. The display panel A further includes a common electrode 210 (illustrated in FIG. 1) disposed between the first substrate 10 and the second substrate 20. An electrical potential difference between the common electrode 210 and a pixel electrode 110 can drive the display medium 3. Thereby, the display panel A is subjected to display an image. In an embodiment of FIG. 1, the pixel electrode 110 and the common electrode 210 may be respectively disposed on the first substrate 10 and the second substrate 20 optionally. The display panel A using the pixel unit 100 may be a twisted nematic (TN), super twisted nematic (STN), vertical alignment (VA), polymer sustained alignment (PSA), optically compensated birefringence (OCB), or other suitable mode of display panel, but the invention is not limited thereto. In other embodiments, the pixel electrode 110 and the common electrode 210 may also be disposed on the same substrate (e.g., the first substrate 10) and both located between the first substrate 10 and the display medium 3. The display panel A may be a fringe-field switching (FFS), in-plane switching (IPS), or other suitable mode of display panel.

Referring to FIG. 1 and FIG. 2, each of the pixel units 100 includes a scan line SL, a data line DL interlaced with the scan line SL, an active element T and the pixel electrode 110. In the embodiment, the active element T includes a semiconductor layer 120, an insulating layer 130 (labeled in FIG. 1) covering the semiconductor layer 120, gates G1 and G2 located on the insulating layer 130, a protective layer 140 (labeled in FIG. 1) covering the gates G1 and G2 and a source electrode S and a drain electrode D located on the protective layer 140. In an embodiment of FIG. 1, the gates G1 and G2 may be located above the semiconductor layer 120. The active element T may be a top gate thin film transistor (top gate TFT), but the invention is not limited thereto. In other embodiments, the active element T may also be a bottom gate or other suitable mode of thin film transistor.

The semiconductor layer 120 of each of the active elements T has channel regions 121a and 121b, a source region 122, a drain region 123, a first connection region 124 and a second connection region 125. The first connection region 124 is connected between the channel region 121a and the source region 122. The second connection region 125 is connected between the channel region 121b and the drain region 123. In the embodiment, the semiconductor layer 120 of each of the active elements T may have a first channel region 121a and a second channel region 121b corresponding to the gates G1 and G2 respectively. A normal projection of the first channel region 121a on the first substrate 10 and a normal projection of the second channel region 121b on the first substrate 10 may be respectively located at two opposite sides of a normal projection of the data line DL on the first substrate 10. The first channel region 121a is connected between the first connection region 124 and the second channel region 121b. The second channel region 121b is connected between the first channel region 121a and the second connection region 125. The semiconductor layer 120 of each of the active elements T may further have a third connection region 126 connected between the first channel region 121a and the second channel region 121b. The data line DL may cross over the third connection region 126. In short, in the embodiment, the active element T may be a dual gate TFT, but the invention is not limited thereto. Referring to FIG. 2, in other embodiments, the active element T may also be a single gate or other suitable mode of TFT, and/or the semiconductor layer 120 may not have the third connection region 126 located above the scan line SL and two sides of the data line DL. In other words, the shape of the semiconductor layer 120 of each of the active elements T is not limited to that shown in FIG. 2. The shape of the semiconductor layer 120 of each of the active elements T may have other suitable design depending on actual needs. For instance, take a pixel unit 100A at the left side of FIG. 2 as an example. In another embodiment, the semiconductor layer 120 of the pixel unit 100A may extend upwardly from the location of a drain D to the location of the scan line SL, then extend rightwardly to an intersection of the scan line SL and a data line DLA along the scan line SL, then extend downwardly along the data line DLA for a short distance, and then extend to the drain D of an adjacent pixel unit 100B and extend downwardly along the drain D of the adjacent pixel unit 100B, so as to form a compensation capacitor with the drain DB of the adjacent pixel unit 100B. Additionally, the shape of the turning of the semiconductor layer 120 is not limited to the right angle as shown in FIG. 2. In other embodiments, the shape of the turning of the semiconductor layer 120 may have an arc shape or other suitable shape.

In the embodiment, electrical conductivity of the source region 122, the first connection region 124, the third connection region 126, the second connection region 125 and the drain region 123 may be higher than that of the channel regions 121a and 121b. For instance, the source region 122, the first connection region 124, the third connection region 126, the second connection region 125 and the drain region 123 may be doped regions in the semiconductor layer 120, and the channel regions 121a and 121b may be undoped regions in the semiconductor layer 120, but the invention is not limited thereto. In the embodiment, a material of the semiconductor layer 120 is poly silicon, for example, but the invention is not limited thereto. In other embodiments, a material of the semiconductor layer 120 may also be amorphous silicon, micro crystal silicon, monocrystalline silicon, an organic semiconductor material, an oxide semiconductor material (e.g., indium-zinc oxide (IZO), indium-gallium-zinc oxide (IGZO), other suitable material, or a combination thereof), or other suitable material.

Referring to FIG. 1, in the embodiment, the insulating layer 130 may be a plurality of insulating films 132 and 134 sequentially stacked on the semiconductor layer 120, but the invention is not limited thereto. In other embodiments, the insulating layer 130 may also be a single film. A material of the insulating layer 130 may be an inorganic material (e.g., silicon oxide, silicon nitride, silicon oxynitride), an organic material, or a combination thereof.

Referring to FIG. 1 and FIG. 2, the gates G1 and G2 of each of the pixel units 100 are electrically connected to the scan line SL. In the embodiment, the gates G1 and G2 may be a portion of the scan line SL. The gates G1 and G2 and the scan line SL may be formed by the same film, but the invention is not limited thereto. In other embodiments, the gates G1 and G2 and the scan line SL may also be formed by different films. Based on the considerations of conductivity, the scan line SL and the gates G1 and G2 may be metal materials, but the invention is not limited thereto. In other embodiments, the scan line SL, the gates G1 and G2 may also use other conductive materials, such as an alloy, a nitride of a metal material, an oxide of a metal material, an oxynitride of a metal material, or a stacked layer of a metal material and other conductive material.

Referring to FIG. 1, in the embodiment, the protective layer 140 may be a plurality of protective films 142 and 144 sequentially stacked on the gates G1 and G2. However, the invention is not limited thereto. In other embodiments, the protective layer 140 may also be a single film. A material of the protective layer 140 may be an inorganic material (e.g., silicon oxide, silicon nitride, silicon oxynitride), an organic material, or a combination thereof.

Referring to FIG. 1 and FIG. 2, the source electrode S and the drain electrode D of each of the pixel units 100 are electrically connected to the source region 122 and the drain region 123 of the semiconductor layer 120, respectively. Specifically, as shown in FIG. 1, in the embodiment, the insulating layer 130 has contact windows 130*a* and 130*b*. The protective layer 140 has contact windows 140*a* and 140*b*. The contact window 130*a* is communicated to the contact window 140*a*. The contact window 130*b* is communicated to the contact window 140*b*. The source electrode S is filled into the contact windows 130*a* and 140*a* to be electrically contacted with the source region 122. The drain electrode D is filled into the contact windows 130*b* and 140*b* to be electrically contacted with the drain electrode 123. As shown in FIG. 1, the source electrode S is electrically connected to the data line DL. In the embodiment, the source electrode S may be a portion of the data line DL. The source electrode S is separated from the drain electrode D. The source electrode S, the drain electrode D and the data line DL may be formed by the same film, but the invention is not limited thereto. In other embodiments, the source electrode S, the drain electrode D and the data line DL may also be formed by different films.

Referring to FIG. 1 and FIG. 2, the pixel electrode 110 of each of the pixel units 100 is electrically connected to the drain electrode D. Specifically, as shown in FIG. 1, in the embodiment, the pixel array substrate 1 further includes a passivation layer 150 covering the source electrode S and the drain electrode D. The passivation layer 150 has a contact window 150*a*. The pixel electrode 110 is disposed on the passivation layer 150 and filled into the contact window 150*a* of the passivation layer 150 to be electrically contacted with the drain electrode D. In the embodiment, the pixel electrode 110 may be a transmissive, reflective, or partially transmissive and partially reflective pixel electrode. A material of the pixel electrode 110 may be a transparent conductive material, a light-reflecting conductive material, or a combination thereof. For instance, the transparent conductive material may be a metal oxide (e.g., indium-tin oxide, indium-zinc oxide, aluminum-tin oxide, aluminum-zinc oxide, indium-gallium oxide, other suitable materials, or a stacked layer of at least two of the above). The light-reflecting conductive material may be metal or other suitable material having high reflectivity, but the invention is not limited thereto.

Referring to FIG. 1 and FIG. 2, it should be noted that, in the pixel unit 100A, the normal projection of at least a portion of the first connection region 124 on the first substrate 10 and the normal projection of the second connection region 125 on the first substrate 10 are located outside the normal projection of the data line DLA on the first substrate 10. Particularly, the normal projection of at least a portion of the first connection region 124 on the first substrate 10 and the normal projection of the second connection region 125 on the first substrate 10 are respectively located at two opposite sides of the normal projection of the data line DL on the first substrate 10. Thereby, the first connection region 124 of the pixel unit 100A and the drain electrode DB of the another adjacent pixel unit 100B may form a significant compensation capacitor Cpd, so as to improve the cross-talk phenomenon.

In the embodiment, the first connection region 124 of the pixel unit 100A and the drain electrode DB of the adjacent pixel unit 100B form the compensation capacitor Cpd. The drain electrode DB of the pixel unit 100B and the first connection region 124 of the pixel unit 100B form a capacitor Cpd'. The electrical potential of the drain electrode DB is equal to the electrical potential of the pixel electrode 110 of the pixel unit 100B. In the embodiment, the data line DLA of the pixel unit 100A and the data line DLB of the another adjacent pixel unit 100B have opposite polarities. The data line DLB is electrically connected to the semiconductor layer 120 of the pixel unit 100B when the gates G1 and G2 of the pixel unit 100B are turned on. That is, the polarity of the data line DLB will be the same as that of the first connection region 124 of the pixel unit 100B. In other words, the first connection region 124 electrically connected to the data line DLA of the pixel unit 100A and the first connection region 124 electrically connected to the data line DLB of the pixel unit 100B have opposite polarities, and the polarity of the drain electrode DB is the same as that of the data line DLB. At this time, the influence of the compensation capacitor Cpd on the electrical potential of the drain DB of the pixel unit 100B and the influence of the capacitor Cpd' on the electrical potential of the drain DB of the pixel unit 100B may be reduced, thereby further improving the cross-talk phenomenon.

Referring to FIG. 2, in the embodiment, in the pixel unit 100A, at least a portion of the normal projection of the first connection region 124 on the first substrate 10 is located between the normal projection of the data line DLA on the first substrate 10 and a normal projection of the drain electrode DB of the another adjacent pixel unit 100B on the first substrate 10. Furthermore, in the embodiment, at least a portion of the first connection region 124 of the pixel unit 100A and the drain electrode DB of the another adjacent pixel unit 100B may be overlapped on the direction z. Thereby, a distance between the first connection region 124 of the pixel unit 100A and the drain electrode DB of the pixel unit 100B is short. The compensation capacitor Cpd formed by the first connection region 124 of the pixel unit 100A and the drain electrode DB of the pixel unit 100B is large, which is helpful to improve the cross-talk phenomenon, but the invention is not limited thereto. In other embodiments, the first connection region 124 of the pixel unit 100A and the drain electrode DB of the pixel unit 100B may not be overlapped, and the first connection region 124 and the drain electrode DB which are not overlapped but quite close to each other may also form the compensation capacitor Cpd, so as to improve the cross-talk phenomenon.

Referring to FIG. 2, in the embodiment, in the pixel unit 100A, a distance d1 between a portion of the normal projection of the first connection region 124 on the first substrate 10 and the normal projection of the data line DLA on the first substrate 10 is smaller than a distance d2 between a portion of the normal projection of the second connection region 125 on the first substrate 10 and the normal projection of the data line DLA on the first substrate 10. In other words, between different sections in the semiconductor layer 120 of the pixel unit 100A in the same direction, a portion of the normal projection of the first connection region 124 on the first substrate 10 is closer to the normal projection of the data line DLA on the first substrate 10, and the normal projection of the second connection region 125 on the first substrate 10 is far away from the normal projection of the data line DLA on the first substrate 10. Furthermore, the region where the semiconductor layer 120 of the pixel unit 100A is in contact with the drain electrode DA is the drain region 123. In the pixel unit 100A, a normal projection of the drain region 123 on the first substrate 10 may be located between a normal projection of a geometric center P of the drain region DA on the first substrate 10 and the normal projection of the data line DLA on the first substrate 10, but the invention is not limited thereto.

Figure 3:
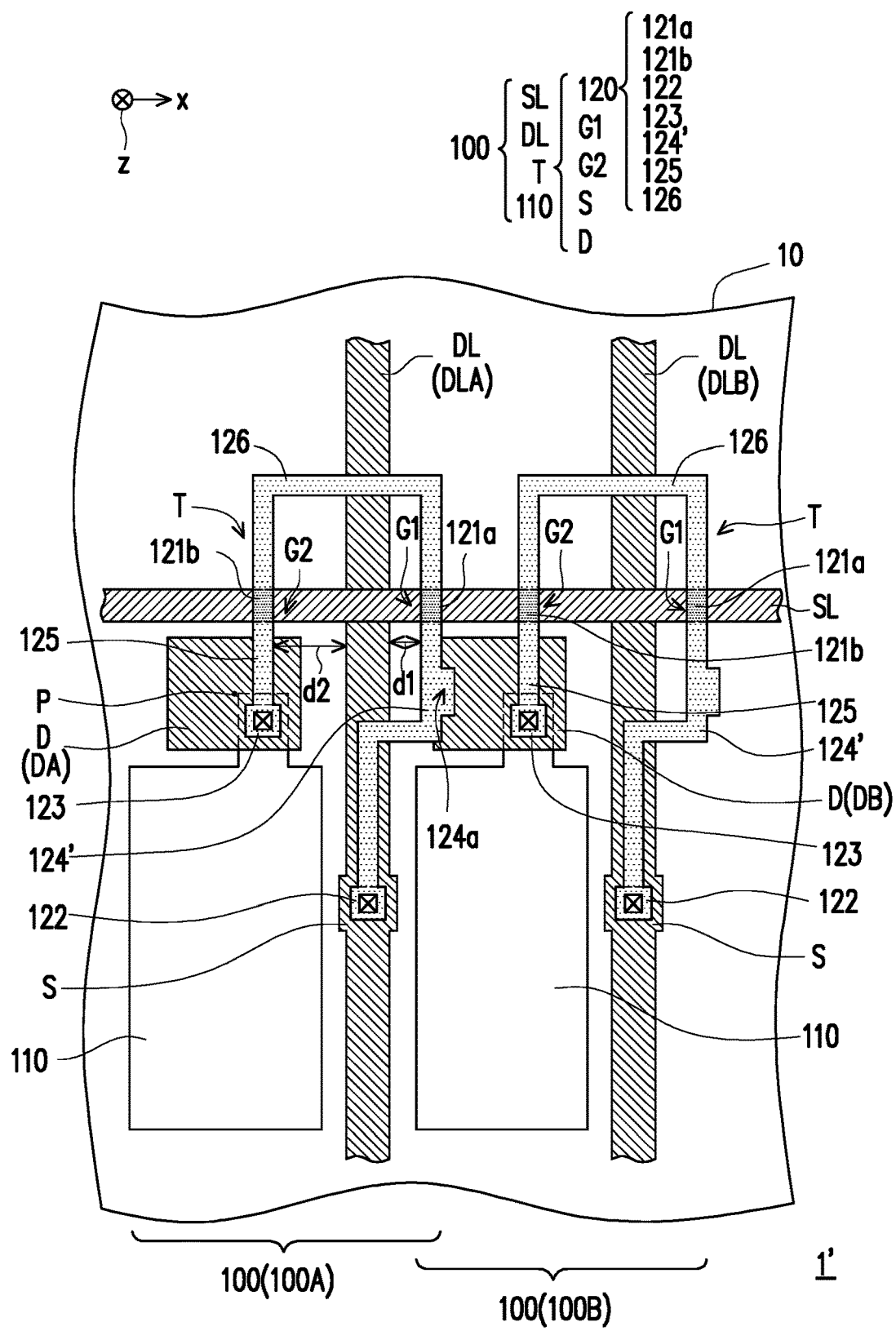
FIG. 3 is a schematic bottom view of the pixel array substrate according to another embodiment of the invention.

FIG. 3 is a schematic bottom view of the pixel array substrate according to another embodiment of the invention. A pixel array substrate 1' of FIG. 3 is similar to the pixel array substrate 1 of FIG. 2, and thus the same or corresponding elements are labeled by the same or corresponding reference numerals. The main difference between the pixel array substrate 1' and the pixel array substrate 1 is that, the shape of a first connection region 124' of the pixel array substrate 1' is different from that of the first connection region 124 of the pixel array substrate 1. The difference will be described below, where the same or corresponding parts may refer to the description above, and will not be repeatedly described.

Referring to FIG. 3, the pixel array substrate 1' includes the first substrate 10 and the plurality of pixel units 100 disposed on the first substrate 10. Each of the pixel units 100 includes the scan line SL, the data line DL, the active element T and the pixel electrode 110. The active element T includes the semiconductor layer 120, the gates G1 and G2, the source electrode S and the drain electrode D. The semiconductor layer 120 has the channel regions 121a and 121b, the source region 122, the drain region 123, the first connection region 124', the second connection region 125 and the third connection region 126. The first connection region 124' is connected between the channel region 121a and the source region 122. The second connection region 125 is connected between the channel region 121b and the drain region 123. The third connection region 126 is connected between the first connection region 124' and the second connection region 125. A normal projection of at least a portion of the first connection region 124' on the first substrate 10 and the normal projection of the second connection region 125 on the first substrate 10 are located outside the normal projection of the data line DL on the first substrate 10. The normal projection of at least a portion of the first connection region 124' on the first substrate 10 and the normal projection of the second connection region 125 on the first substrate 10 are respectively located at two opposite sides of the normal projection of the data line DL on the first substrate 10.

The difference between the pixel array substrate 1' and the pixel array substrate 1 is that, the first connection region 124' of the pixel unit 100A may have a protruding portion 124a. The protruding portion 124a protrudes toward a direction x away from the data line DLA, and the protruding portion 124a overlaps the drain electrode DB of the another adjacent pixel unit 100B in a normal projection direction of the first substrate 10. By using the protruding portion 124a, the overlapping area of the first connection region 124' and the drain electrode DB becomes larger, and the compensation capacitor Cpd formed by the first connection region 124' and the drain electrode DB also becomes larger. Thereby, the cross-talk phenomenon is further improved. Additionally, in an embodiment of FIG. 3, the shape of the protruding portion 124a is a rectangular shape as an example, but the invention is not limited thereto. In other embodiments, the shape of the protruding portion 124a may have other suitable design depending on actual needs.

Figure 4:
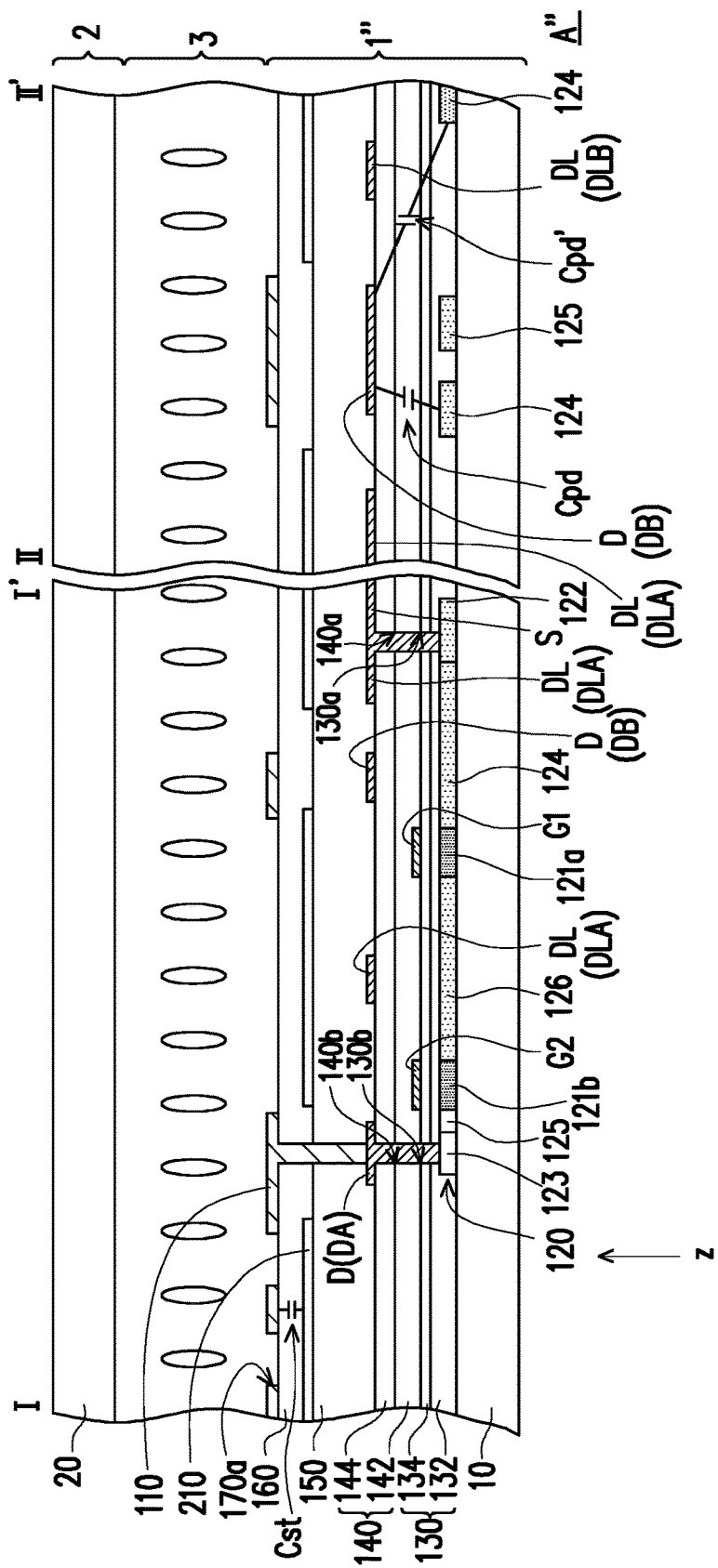
FIG. 4 is a schematic cross-sectional view of the display panel according to another embodiment of the invention.
Figure 5:
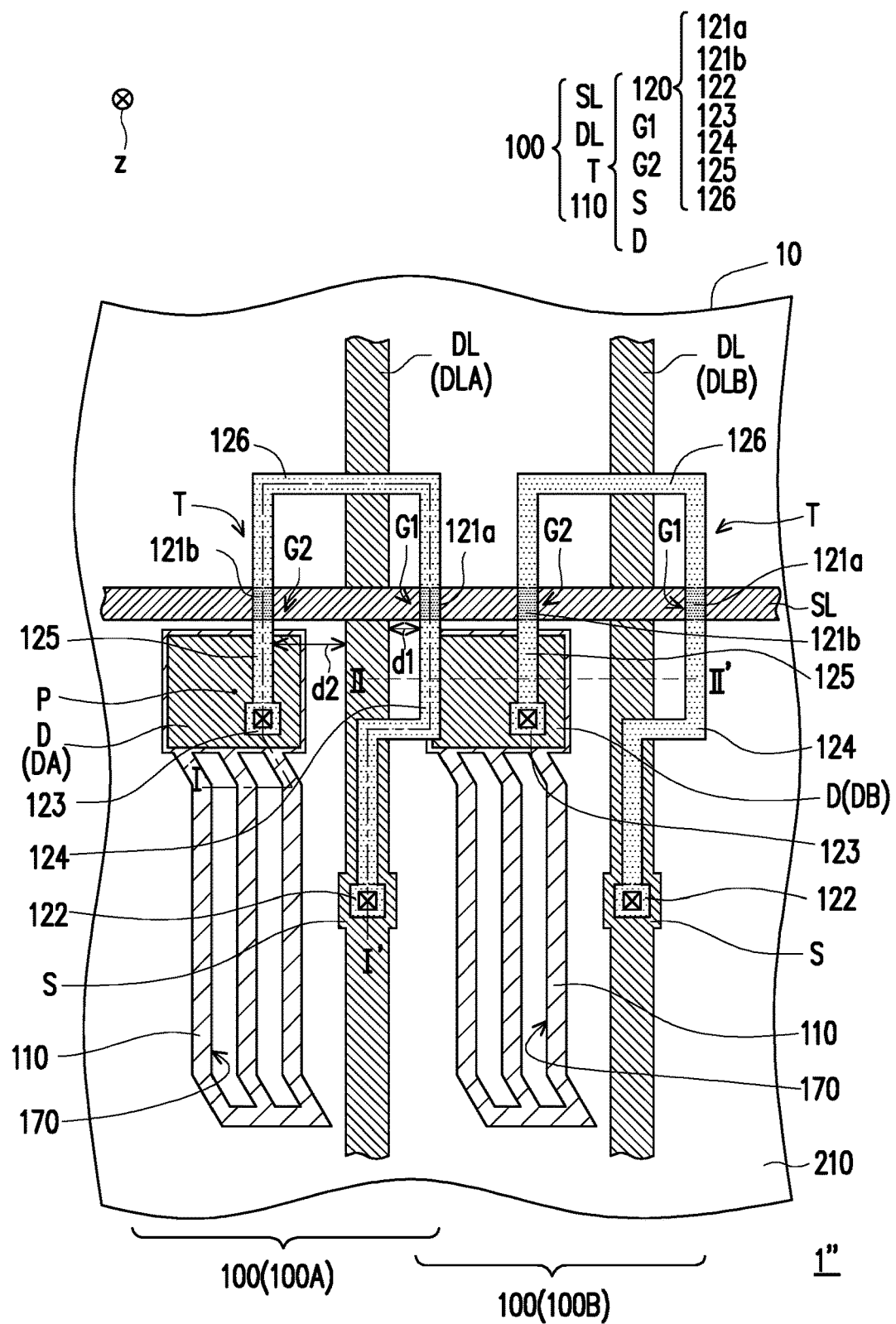
FIG. 5 is a schematic bottom view of the pixel array substrate of FIG. 4.

FIG. 4 is a schematic cross-sectional view of the display panel according to another embodiment of the invention. FIG. 5 is a schematic bottom view of a pixel array substrate 1" of FIG. 4. The pixel array substrate 1" of FIG. 4 is corresponding to section lines I-I' and II-II' of FIG. 5. The schematic bottom view of FIG. 5 is a schematic view taken along the direction z of FIG. 4. The main difference between a display panel A" of FIG. 4 and the display panel A of FIG. 1 is that, the pixel electrode 110 and the common electrode 210 of the display panel A" may be both disposed on the first substrate 10. Furthermore, the pixel array substrate 1" further includes an insulating layer 160 located between the pixel electrode 110 and the common electrode 210. One of the pixel electrode 110 and the common electrode 210 has a plurality of slits 170, and the other of the pixel electrode 110 and the common electrode 220 is overlapped with the slits 170. Additionally, in the embodiment, the common electrode 210 is located below the insulating layer 160, and the pixel electrode 110 is located above the insulating layer 160, but the invention is not limited thereto. In other embodiments, the pixel electrode 110 may be located below the insulating layer 160, and the common electrode 210 may be located above the insulating layer 160. In other words, the display panel A" is a fringe-field switching (FFS) mode of display panel, for example, but the invention is not limited thereto. If the pixel electrode and the common electrode of the display panel are disposed on the same substrate, the display panel may also be an in-plane switching (IPS), or other suitable mode of display panel. The display panel A" of the embodiment has similar effects and advantages as the display panel A described above, and will not repeated again.

Referring to FIG. 4 and FIG. 5, in an embodiment of the invention, each of the pixel units 100 may have a storage capacitor Cst. The storage capacitor Cst is at least formed by the common electrode 210 and the pixel electrode 110 of the pixel array substrate 1". The ratio of the compensation capacitor Cpd and the storage capacitor Cst may be controlled within a certain range to facilitate the overall electrical property of the display panel A". For instance, in the embodiment, it may be 0.1%≤Cpd/Cst≤25%, preferably 0.1%≤Cpd/Cst≤10%, more preferably 0.5%≤Cpd/Cst≤4%, but the invention is not limited thereto. Table 1 shows the relationships of the compensation capacitor Cpd, the ratio of the compensation capacitor Cpd and the storage capacitor Cst, and the cross-talk of various display panels. The following Table 1 can be certified that, when the ratio of the compensation capacitor Cpd and the storage capacitor Cst is larger than or equal to 0.5% and smaller than or equal to 4%, the cross-talk issue of the display panel A" including the pixel array substrate 1" is significantly improved compared with the conventional display panel.

|  | Conventional display panel | Display panel including pixel array substrate 1" | Display panel including pixel array substrate 1' |
|---|---|---|---|
| Cpd (fF) | 0 | 0.7 | 2.5 |
| Cpd/Cst | 0% | 0.63% | 2.2% |
| cross-talk | 2.2 | 0.9 | −0.04 |

Similarly, the ratio of the compensation capacitor Cpd and the storage capacitor Cst of the display panel A of FIG. 1 and FIG. 2 and/or the display panel including the pixel array substrate 1' of FIG. 3 may be controlled within the above range to facilitate the overall electrical property. In the display panel A and/or the display panel including the pixel array substrate 1' of FIG. 3, the pixel array substrate 1 and/or the pixel array substrate 1' may optionally include a common electrode line (not shown) electrically connected to the common electrode 210. The storage capacitor Cst includes the capacitor formed by the common electrode 210 located on the second substrate 20 and the pixel electrode 110 located on the first substrate 10, and further includes the capacitor formed by the common electrode line and the pixel electrode 110 both located on the first substrate 10.

In summary, the pixel array substrate of an embodiment of the invention includes the plurality of pixel units. Each of the pixel units includes the scan line, the data line, the active element and the pixel electrode. The active element includes the semiconductor layer, the gate, the source electrode and the drain electrode. Particularly, a portion of the semiconductor layer of each of the pixel units is shifted to the pixel region of the adjacent pixel unit. The shifted portion of the semiconductor layer and the drain electrode of the adjacent pixel unit may form the compensation capacitor, thereby improving the cross-talk phenomenon and increasing the display quality.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A pixel array substrate, comprising:
    a substrate; and
    a plurality of pixel units, disposed on the substrate, each of the pixel units comprising:
        a scan line and a data line, interlaced with each other; and
        an active element, comprising:
            a semiconductor layer, having at least one channel region, a source region, a drain region, a first connection region and a second connection region, the first connection region being connected between the at least one channel region and the source region, the second connection region being connected between the at least one channel region and the drain region, wherein a normal projection of the first connection region on the substrate and a normal projection of the second connection region on the substrate are respectively located at two opposite sides of a normal projection of the data line on the substrate;
            a gate, located on the substrate and electrically connected to the scan line;
            an insulating layer, disposed between the semiconductor layer and the gate; and
            a source electrode and a drain electrode, electrically connected to the source region and the drain region respectively, wherein the source electrode is electrically connected to the data line;
    wherein at least a portion of the normal projection of the first connection region on the substrate is located between the normal projection of the data line on the substrate and a normal projection of a drain electrode of another adjacent pixel unit on the substrate,
    wherein a distance between a portion of the normal projection of the first connection region on the substrate and the normal projection of the data line on the substrate is smaller than a distance between a portion of the normal projection of the second connection region on the substrate and the normal projection of the data line on the substrate.

2. The pixel array substrate according to claim 1, wherein the data line of each of the pixel units and a data line of the another adjacent pixel unit have opposite polarities.

3. The pixel array substrate according to claim 1, wherein the at least a portion of the first connection region overlaps the drain electrode of the another adjacent pixel unit in a normal projection direction of the substrate.

4. The pixel array substrate according to claim 3, wherein the at least a portion of the first connection region has a protruding portion, the protruding portion protrudes along a direction away from the data line, and the protruding portion overlaps the drain electrode of the another adjacent pixel unit in the normal projection direction of the substrate.

5. The pixel array substrate according to claim 1, wherein each of the pixel units further comprises:
    a storage capacitor Cst, wherein the first connection region and the drain electrode of the another adjacent pixel unit form a compensation capacitor Cpd, and the storage capacitor Cst and the compensation capacitor Cpd have a ratio of Cpd/Cst, and 0.1%≤Cpd/Cst≤25%.

6. The pixel array substrate according to claim 1, wherein at least one channel region of the semiconductor layer comprises a first channel region and a second channel region, a normal projection of the first channel region on the substrate and a normal projection of the second channel region on the substrate are respectively located at the two opposite sides of the normal projection of the data line on the substrate, the first channel region is connected between the first connection region and the second channel region, and the second channel region is connected between the first channel region and the second connection region.

7. The pixel array substrate according to claim 6, wherein the semiconductor layer further has a third connection region, the third connection region is connected between the first channel region and the second channel region, and the data line crosses over the third connection region.

8. The pixel array substrate according to claim 1, wherein a region where the semiconductor layer is in contact with the drain electrode is the drain region; in each of the pixel units, a normal projection of the drain region on the substrate is located between a normal projection of a geometric center of the drain electrode on the substrate and the normal projection of the data line on the substrate.

9. The pixel array substrate according to claim 1, wherein the semiconductor layer comprises poly silicon.

10. A pixel array substrate, comprising:
a substrate; and
a plurality of pixel units, disposed on the substrate, each of the pixel units comprising:
  a scan line and a data line, interlaced with each other; and
  an active element, comprising:
    a semiconductor layer, having at least one channel region, a source region, a drain region, a first connection region and a second connection region, the first connection region being connected between the at least one channel region and the source region, the second connection region being connected between the at least one channel region and the drain region, wherein a normal projection of the first connection region on the substrate and a normal projection of the second connection region on the substrate are respectively located at two opposite sides of a normal projection of the data line on the substrate;
    a gate, located on the substrate and electrically connected to the scan line;
    an insulating layer, disposed between the semiconductor layer and the gate;
    a source electrode and a drain electrode, electrically connected to the source region and the drain region respectively, wherein the source electrode is electrically connected to the data line;
  wherein at least a portion of the first connection region overlaps a drain electrode of another adjacent pixel unit in a normal projection direction of the substrate.

11. The pixel array substrate according to claim 10, wherein two data lines of any two adjacent pixel units have opposite polarities.

12. The pixel array substrate according to claim 10, wherein the at least a portion of the first connection region has a protruding portion, the protruding portion protrudes along a direction away from the data line, and the protruding portion overlaps the drain electrode of the another adjacent pixel unit in the normal projection direction of the substrate.

13. The pixel array substrate according to claim 10, wherein a distance between a portion of the normal projection of the first connection region on the substrate and the normal projection of the data line on the substrate is smaller than a distance between a portion of the normal projection of the second connection region on the substrate and the normal projection of the data line on the substrate.

14. The pixel array substrate according to claim 10, wherein each of the pixel units further comprises:
  a storage capacitor Cst, wherein the first connection region and the drain electrode of another adjacent pixel unit form a compensation capacitor Cpd, the storage capacitor Cst and the compensation capacitor Cpd have a ratio of Cpd/Cst, and $0.1\% \leq Cpd/Cst \leq 25\%$.

15. The pixel array substrate according to claim 10, wherein at least one channel region of the semiconductor layer comprises a first channel region and a second channel region, a normal projection of the first channel region on the substrate and a normal projection of the second channel region on the substrate are respectively located at the two opposite sides of the normal projection of the data line on the substrate, the first channel region is connected between the first connection region and the second channel region, and the second channel region is connected between the first channel region and the second connection region.

16. The pixel array substrate according to claim 15, wherein the semiconductor layer further has a third connection region, the third connection region is connected between the first channel region and the second channel region, and the data line crosses over the third connection region.

17. The pixel array substrate according to claim 10, wherein a region where the semiconductor layer is in contact with the drain electrode is the drain region; in each of the pixel units, a normal projection of the drain region on the substrate is located between a normal projection of a geometric center of the drain electrode on the substrate and the normal projection of the data line on the substrate.

18. The pixel array substrate according to claim 10, wherein the semiconductor layer comprises poly silicon.

19. A pixel array substrate, comprising:
a substrate; and
a plurality of pixel units, disposed on the substrate, each of the pixel units comprising:
a scan line and a data line, interlaced with each other; and
an active element, comprising:
  a semiconductor layer, having at least one channel region, a source region, a drain region, a first connection region and a second connection region, the first connection region being connected between the at least one channel region and the source region, the second connection region being connected between the at least one channel region and the drain region, wherein a normal projection of the first connection region on the substrate and a normal projection of the second connection region on the substrate are respectively located at two opposite sides of a normal projection of the data line on the substrate;
  a gate, located on the substrate and electrically connected to the scan line;
  an insulating layer, disposed between the semiconductor layer and the gate; and
  a source electrode and a drain electrode, electrically connected to the source region and the drain region respectively, wherein the source electrode is electrically connected to the data line;
wherein at least a portion of the normal projection of the first connection region on the substrate is located between the normal projection of the data line on the substrate and a normal projection of a drain electrode of another adjacent pixel unit on the substrate,
wherein each of the pixel units further comprises:
  a storage capacitor Cst, wherein the first connection region and the drain electrode of the another adjacent pixel unit form a compensation capacitor Cpd, and the storage capacitor Cst and the compensation capacitor Cpd have a ratio of Cpd/Cst, and $0.1\% \leq Cpd/Cst \leq 25\%$.

* * * * *